United States Patent [19]
Brugge et al.

[11] Patent Number: 5,493,132
[45] Date of Patent: Feb. 20, 1996

[54] INTEGRATED CIRCUIT CONTACT BARRIER FORMATION WITH ION IMPLANT

[75] Inventors: Hunter B. Brugge, San Antonio, Tex.; Kuang-Yeh Chang, Los Gatos, Calif.; Felix Fujishiro, San Antonio, Tex.; Chang-Ou Lee, Austin, Tex.; Walter D. Parmantie, San Antonio, Tex.

[73] Assignee: VLSI Technology, Inc., San Jose, Calif.

[21] Appl. No.: 394,221

[22] Filed: Feb. 24, 1995

Related U.S. Application Data

[63] Continuation of Ser. No. 219,231, Mar. 29, 1994, abandoned, which is a continuation of Ser. No. 811,403, Dec. 20, 1991, abandoned.

[51] Int. Cl.$^6$ .................................................... H01L 33/00
[52] U.S. Cl. .................... 257/101; 257/102; 257/655; 257/763; 257/764
[58] Field of Search ......................... 357/67, 68, 91; 257/101, 102, 763, 764, 655

[56] References Cited

U.S. PATENT DOCUMENTS

| | | | |
|---|---|---|---|
| 4,818,712 | 4/1989 | Tully | 357/91 |
| 4,853,760 | 11/1991 | Abe et al. | 357/91 |
| 5,065,220 | 11/1991 | Paterson et al. | 357/67 |

FOREIGN PATENT DOCUMENTS

| | | | |
|---|---|---|---|
| 278001A1 | 4/1990 | Germany | 21/28 |
| 60138916 | 11/1985 | Japan | 21/28 |
| 2026052 | 1/1990 | Japan | 21/90 |

OTHER PUBLICATIONS

"Treatmennt of WTi Contacts on Silicon with Low Energy Argon Ions" (Milosavljevic et al), v. 164, 1988 *Thin Solid Films*.

Primary Examiner—Edward Wojciechowicz
Attorney, Agent, or Firm—Clifton L. Anderson

[57] ABSTRACT

A titanium-tungsten barrier layer is sputtered after active areas of a CMOS structure are exposed. An ion implant through the barrier layer and into the active areas disrupts the boundaries between the barrier layer and the underlying active areas. The implant can involve argon or, alternatively, silicon. The resulting structure is annealed. A conductor layer of an aluminum-copper alloy is deposited. An antireflection coating of TiW is deposited. The three-layer structure is then photolithographically patterned to define contacts and local interconnects. The ion implant before anneal results in less contact resistance, which is particularly critical for the barrier layer boundary with positively doped active areas.

6 Claims, 2 Drawing Sheets

INTEGRATED CIRCUIT CONTACT BARRIER FORMATION WITH ION IMPLANT

This is a continuing application of U.S. patent application Ser. No. 08/219,231, filed Mar. 29, 1994, which is a continuing application of U.S. patent application Ser. No. 08/811,403, filed Dec. 20, 1991, both now abandoned.

BACKGROUND OF THE INVENTION

The present invention relates to integrated circuits and, more particular, to improved integrated circuit contact formation. A major objective of the present invention is to reduce contact resistance between tungsten based barrier metal and underlying active semiconductor regions.

Modem technological progress has been closely identified with the increasing performance and miniaturization associated with developments in integrated circuit fabrication. Integrated circuit structures are formed by patterning negatively and positively doped regions within a semiconductor structure. On-chip circuits and external interfacing require contacts to be formed with the doped regions.

Conventionally, contacts can be formed by patterning aluminum over the doped regions. Aluminum is favored because it is highly conductive, inexpensive, and relatively easily to pattern. However, aluminum from the contact can migrate into a silicon substrate through a doped region, causing a short to the substrate. This problem can be mitigated by including silicon in the aluminum. However, contact resistance goes up, because silicon is not a good conductor. Furthermore, silicon and aluminum migration can still occur, especially during elevated temperatures.

To minimize this shorting, some processing techniques deposit a barrier layer before depositing the aluminum. One type of barrier material is titanium-tungsten. However, the effectiveness of the resulting contact is limited by the contact resistance between the titanium-tungsten and the doped regions. This contact resistance is greater for positively doped regions than for negatively doped regions; in fact, the contact between the tungsten and positively doped silicon can be non-ohmic. Contact resistance is of particular concern in CMOS (complementary metal-oxide-silicon) technology, which includes barrier metal contacts with positively doped regions as well as with negatively doped region.

This resistance can be reduced by annealing. Further improvements can be attained by using platinum silicide under the barrier metal. Platinum must be deposited and then a silicide formed. This process is complex and expensive. Subsequent high-temperature processing is limited, undesirably constraining packaging procedures. Furthermore, platinum raises contamination concerns as it can kill the minority carrier.

Furthermore, as integrated circuit devices are defined more finely, contact resistance becomes more critical. Thus, formerly adequate approaches for limiting contact resistance are becoming less adequate. What is needed is a method for further reducing contact resistance when a barrier layer is utilized.

SUMMARY OF THE INVENTION

In accordance with the present invention, a method of applying a contact to a semiconductor structure involves an ion implant through a barrier layer to perturb the lower boundary thereof before an annealing step. More specifically, the refractory metal of the barrier layer is deposited, an ion implant is performed, the resulting structure is annealed, a contact metal is deposited, and the resulting multi-layer contact structure is patterned to define the desired contacts and local interconnects. Preferably, the barrier metal is a titanium-tungsten alloy, and the implant is either of silicon or an inert gas, such as argon. The contact metal can be of aluminum or an aluminum-copper alloy.

The perturbed and annealed boundary between the barrier metal and the underlying semiconductor structure results in a lower contact resistance than is achieved with annealing alone (without boundary perturbation by ion implant). Tests indicate about a 85% reduction in contact resistance for a negatively doped semiconductor region and a 40% reduction for a positively doped semiconductor region. This approach is simpler and less costly than those relying on platinum depositions. These and other features and advantages of the present invention are apparent from the description below with reference to the following drawings.

DESCRIPTION OF THE PREFERRED EMBODIMENTS

Figure 1A:
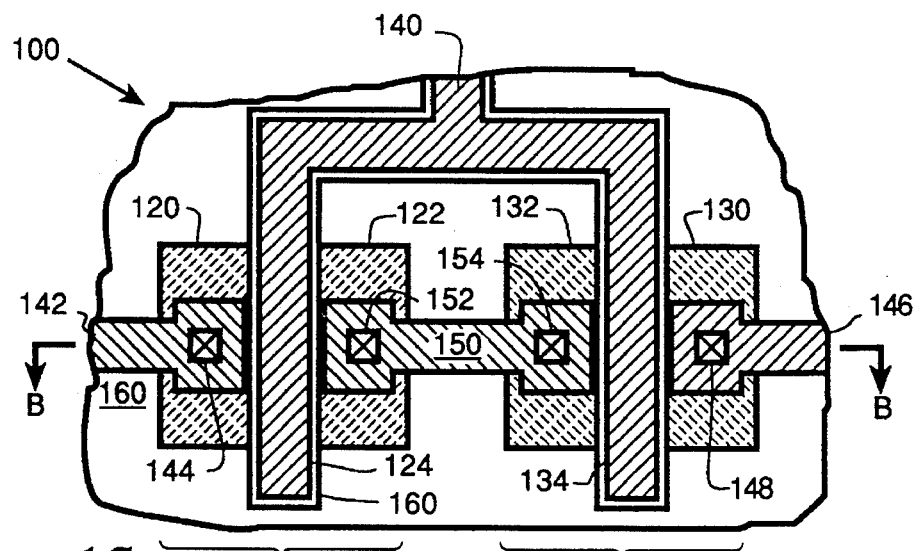
FIGS. 1A and 1B are plan and section views respectively of a CMOS inverter incorporating the present invention.
Figure 1B:
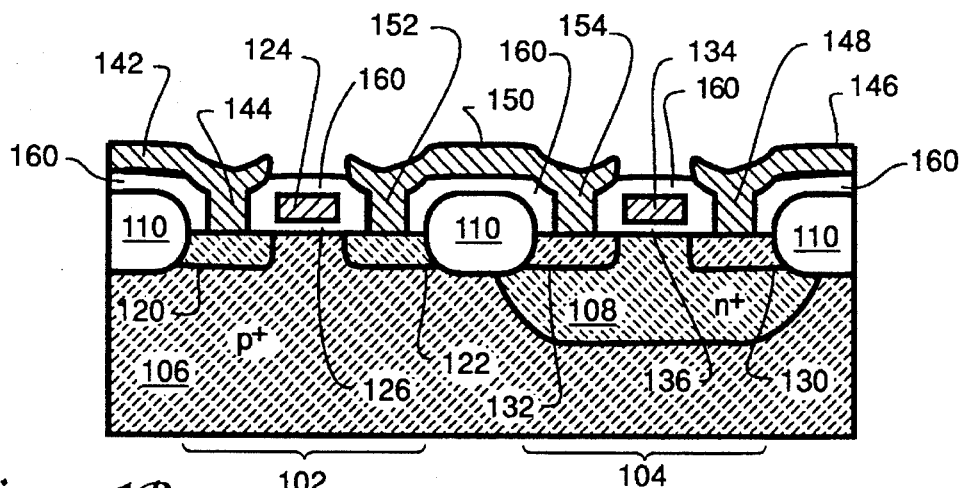

In accordance with the present invention, a CMOS inverter 100 comprises an NMOS transistor 102, and a PMOS transistor 104, fabricated on a substrate 106. Substrate 106 is of p-type silicon which includes an n-well 108 in which PMOS transistor 104 is fabricated, as indicated in FIG. 1B. Transistors 102 and 104 are isolated from each other and neighboring transistors (not shown) by field oxides 110.

NMOS transistor 102 comprises a source 120 and a drain 122, between which current can be carried at a rate regulated by the voltage at a gate 124 of transistor 102. Gate 124 is insulated from the silicon below by a gate oxide 126. Similarly, PMOS transistor 104 comprises a source 130, a drain 132, and a gate 134, the latter being isolated by a gate oxide 136.

The input to CMOS inverter 100 is provided via polysilicon line 140, which is formed integrally with and is electrically coupled to both polysilicon gates 124 and 134. A line 142 provides access to NMOS source 120 through an integral contact 144. A line 146 provides access to PMOS source 130 through an integral contact 148. Drains 122 and 132 serve as outputs for inverter 100. An interconnect 150 electrically connects NMOS drain 122 with PMOS drain 132 through respective contacts 152 and 154. Lines 142 and 146 and interconnect 150 are formed in a common photolithographic procedure of an aluminum alloy with 0.5% copper. An oxide deposition 160 insulates gates 124 and 134.

Fabrication of CMOS inverter 100 can begin in a conventional manner. N-well 108 is defined by introducing n-type dopant in the region of p-type substrate 106 at which PMOS transistor 104 is to be defined so that the conductivity type of the region is reversed. Field oxide 110 is formed conventionally. A relatively short oxide growth cycle is then used to define gate oxides 126 and 136 between the field oxides. Polysilicon is then deposited and heavily doped over the field and gate oxides to increase its conductivity. The polysilicon is then lithographically patterned to define gates 124 and 134 and remote interconnect 140. Oxide 160 is deposited over drain and source regions for isolation and apertures for contacts 144, 152, 154, and 148 are opened. The structure and formation of lines 142 and 144 is the same as that described immediately below for interconnect 150.

Figure 2:
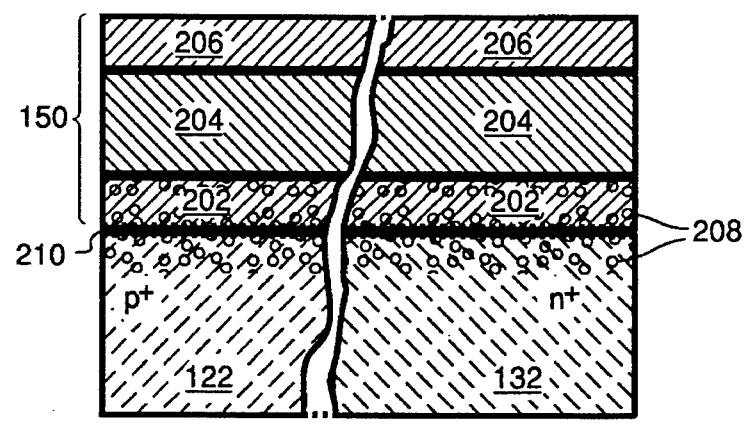
FIG. 2 is a detail section view of a portion of the inverter of FIGS. 1A and 1B.

Interconnect 150 comprises a barrier metal layer 202, a main conductor layer 204, and an antireflection layer 206. Barrier layer 202 and antireflection layer 206 are both titanium-tungsten alloy, about 10% titanium and 90% tungsten. Conductor layer 204 is an aluminum alloy with 0.5% copper. Implanted in the structure of FIG. 2 are implanted atoms 208. These atoms 208, which are preferably of silicon, extend through barrier layer 202 and into drains 122 and 132 below. The boundary 210 between barrier layer 202 and the drains is shown perturbed. Perturbation occurs during the implanting of atoms 208.

Figure 3:
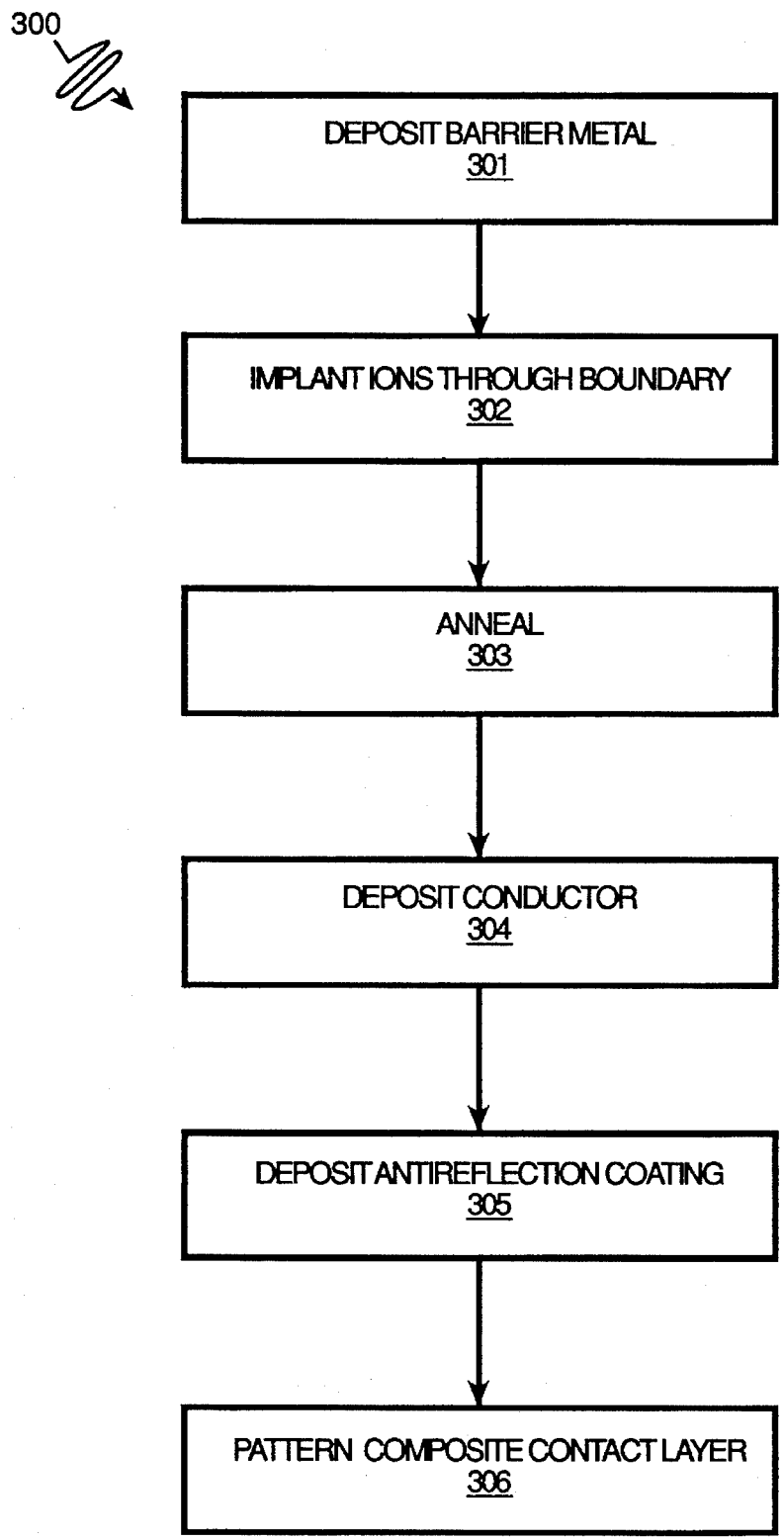
FIG. 3 is a flow chart of a method in accordance with the present invention resulting in the structure of FIG. 1.

The method 300 in accordance with the present invention for forming interconnect 150 is illustrated in FIG. 3. Barrier layer 202 is sputtered on to a thickness of 1500–2500 Å, preferably 2200 Å. Ions are implanted through barrier layer 202, through boundary 210, and into the underlying semiconductor material. Boundary 210 is disrupted by the implanted atoms 208. An anneal at 700° C. is performed at step 303, causing the barrier metal and silicon to fuse at or near disrupted boundary 210. Conductor 204 is then deposited at step 304. Antireflection coating 206 is applied at step 305. The resulting threelayer structure is photolithographically patterned at step 306.

Since the purpose of the implanting step 302 is to perturb barrier metal boundary 210, there is some flexibility in the selection of the chemical for implanting. The mass and size of the atoms should be selected for effective penetration and perturbation. It can be difficult to attain sufficient perturbation with very light elements. It can be difficult to attain sufficient energy to drive a large and heavy ion through the barrier metal. Other than momentum-related issues, the major consideration is lack of negative side effects. The particles should not disturb the electrical properties of the materials in which they are implanted.

These considerations point to three types of candidate materials. The first type includes inert foreign materials, such as inert gases. Argon is preferred, having an appropriate size and weight for perturbing boundary 210. Argon at 400 keV and a dose of $10^{14}$ atoms/cm$^2$ results in an 84% reduction in contact resistance with a negatively doped region and a 40% reduction for the positively doped region (relative to annealing with no implant).

A second type includes neutral materials already prevalent in the structure. The preferred implant is silicon. Alternatively, barrier metal ions, titanium or tungsten, could be implanted. However, there would be some increased risk of punch through in this case. Silicon tetrafluoride can be used as the source gas for the silicon ion implant. Implant energy can be about 200–600 keV, with an implant dose of $10^{15}$–$10^{16}$ atoms/cm$^2$.

A third type includes carrier-compatible materials, i.e., positive and negative dopants. For example, boron or other p-type dopant can be implanted through the barrier metal and into PMOS sources and drains. To avoid neutralization of negative carriers, NMOS sources and drains should be masked during p-type implants. In a complementary procedure, arsenic or phosphorous can be implanted though the barrier metal, with the PMOS sources and drains masked. The dopants implanted into the substrate can supplement dopants introduced before the barrier metal is deposited.

CMOS inverter 100 is built using 0.8 micron technology. Gates 124 and 134 are polysilicon, as is remote interconnect 140. Alternatively, polycide or tungsten-polycide gates and remote interconnects can be used. The barrier metal is preferably tungsten or a tungsten alloy. The preferred alloy is 10% titanium, however, 5–15% titanium is equally satisfactory. Other metals in periodic table groups V–VII can be used as the barrier metal, such as molybdenum. These can be alloyed with other metals, such as titanium. The main conductor layer can include aluminum, copper, silver, gold, combinations of these or other groups I–III metals. These and other modification to and variations upon the embodiments described above are provided for by the present invention, the scope of which is limited only by the following claims.

We claim:

1. An integrated circuit structure comprising:

a substrate including a doped silicon region having argon implanted therein;

a transition metal disposed over and in contact with said doped silicon region so as to form a boundary therewith, said transition metal having had said argon implanted therethrough so that said boundary is disrupted; and a conductive metal disposed over and contacting said transition metal, said conductive metal being more conductive than said transition metal.

2. A CMOS structure comprising:

a substrate including a positively doped active region and a negatively doped active region;

a tungsten-bearing barrier metal layer in contact with both of said active regions so as to define respective boundaries therewith;

an aluminum-bearing conductor layer over and in contact with said barrier metal layer; and a nonmetallic atomic species implanted entirely through said barrier metal layer so that
some of said atomic species ends up in both of said active regions,
some of said atomic species ends up in said barrier metal layer, but not in said conductor layer, and
said boundaries are disrupted.

3. A CMOS structure as recited in claim 2 wherein said atomic species is argon.

4. A CMOS structure as recited in claim 2 wherein said atomic species is silicon.

5. A CMOS structure as recited in claim 2 wherein said barrier metal electrically connects said positively doped active region with said negatively doped active region.

6. A CMOS structure as recited in claim 2 wherein said aluminum bearing conductor layer is in contact with said barrier metal layer.

\* \* \* \* \*